United States Patent [19]
Fonderie et al.

[11] Patent Number: 5,583,465
[45] Date of Patent: Dec. 10, 1996

[54] METHOD AND APPARATUS FOR IMPROVING THE SPEED AND ACCURACY OF A CIRCUIT UTILIZING A FEEDBACK AMPLIFIER CONFIGURATION

[75] Inventors: Maarten Fonderie; Edmond Toy, both of Sunnyvale, Calif.

[73] Assignee: Philips Electronics North America Corporation, New York, N.Y.

[21] Appl. No.: 437,751

[22] Filed: May 9, 1995

[51] Int. Cl.⁶ ............................................. H03F 3/45
[52] U.S. Cl. ............................................. 330/260; 327/54
[58] Field of Search ........................... 330/252, 260, 330/261, 311; 327/54

[56] References Cited

U.S. PATENT DOCUMENTS 4,595,883  6/1986  Nakayana .................... 330/260 X
5,075,636  12/1991 Addis et al. ................... 330/260

*Primary Examiner*—Steven Mottola
*Attorney, Agent, or Firm*—Steven R. Biren

[57] ABSTRACT

An apparatus and method for improving the speed and accuracy of a feedback amplifier when the primary feedback around the amplifier configuration has been interrupted is provided. An additional feedback loop added to the input stage of the amplifier maintains the circuit response by maintaining the feedback and preventing the saturation of the circuit components.

10 Claims, 4 Drawing Sheets

METHOD AND APPARATUS FOR IMPROVING THE SPEED AND ACCURACY OF A CIRCUIT UTILIZING A FEEDBACK AMPLIFIER CONFIGURATION

BACKGROUND OF THE INVENTION

1. Field of the Invention

The present invention relates to feedback amplifiers. More particularly, it relates to a method of improving the speed and accuracy of a circuit utilizing a feedback amplifier configuration, such as, for example, a peak detector.

2. The Prior Art

In a basic peak detector circuit, as the input voltage increases, the feedback configuration of the circuit causes the circuit to go into a voltage follower mode. That is, the output voltage is equal to the input voltage. When the input voltage subsequently decreases, the feedback is interrupted, thereby causing the circuit elements to leave their normal operation mode. When the feedback is then restored, recovery of the circuit can take too long to allow for accurate tracking of the input signals.

SUMMARY OF THE INVENTION

The present invention provides an additional feedback loop added to the basic feedback configuration of a peak detector to enable faster and more accurate recovery after the primary feedback around the amplifier configuration has been interrupted.

It is therefore an object of the present invention to provide an apparatus and method for improving the speed and accuracy of a circuit utilizing a feedback amplifier configuration.

It is another object of the invention to provide an apparatus and method for increasing the recovery rate of the feedback loop in a circuit utilizing a feedback amplifier configuration.

Yet another object of the invention is to provide an apparatus and method for increasing the recovery rate of the feedback loop in a circuit utilizing a feedback amplifier configuration that operates efficiently and reliably.

BRIEF DESCRIPTION OF THE DRAWINGS

Other objects and features of the present invention will become apparent from the following detailed description considered in connection with the accompanying drawings which disclose an embodiment of the present invention. It should be understood, however, that the drawings are designed for the purpose of illustration only and not as a definition of the limits of the invention.

In the drawing, wherein similar reference characters denote similar elements throughout the several views.

DETAILED DESCRIPTION OF PREFERRED EMBODIMENTS

Figure 1:
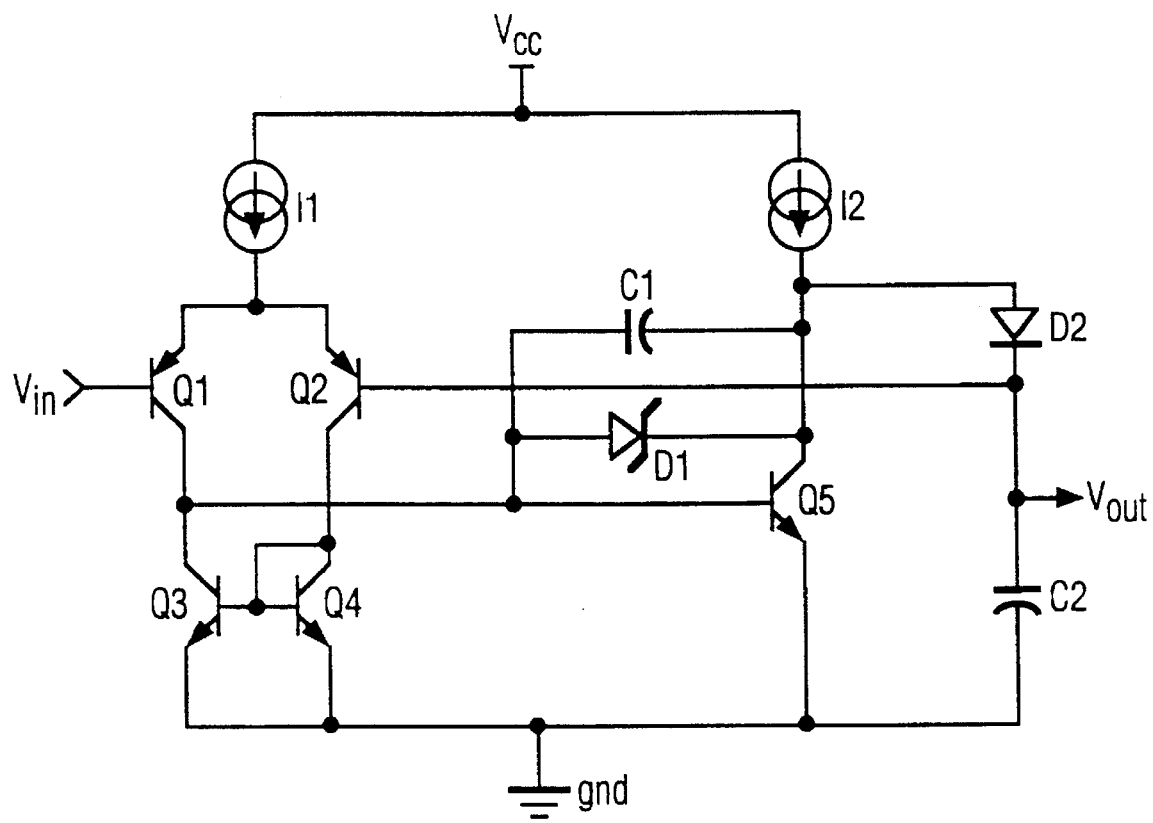
FIG. 1 is a schematic circuit diagram of a peak detector of the prior art.

FIG. 1 shows a peak detector circuit of the prior art. The peak detector circuit consists of an input stage Q1, Q2 followed by a second stage Q5, a diode D2, and capacitor C2. As the input voltage $V_{in}$ increases, the feedback from the output to the base of Q2 forces the circuit into a voltage follower mode (i.e., the output voltage is equal to the input voltage). If the input voltage $V_{in}$ decreases, the voltage on capacitor C2 remains constant and the feedback to the base of Q2 is interrupted. Diode D2 is biased to only allow current to flow from current source I2 to capacitor C2 and not vice versa.

When the input voltage decreases, the difference between the input voltage $V_{in}$ and the output voltage $V_{out}$ is negative, thereby forcing the collector voltage ($V_{cQ5}$) of the second stage input transistor Q5 to go negative and Q5 into saturation. Therefore, when the input voltage $V_{in}$ subsequently increases beyond the voltage stored at the output on capacitor C2, the collector voltage of Q5 ($V_{cQ5}$) is brought back up. As a result of the saturation of Q5, the charge built up on the base of Q5 causes this response to be delayed.

One well-known method of preventing saturation is to clamp transistor Q5 with a Schottky diode D1. When the input voltage $V_{in}$ increases beyond the stored output voltage, the collector voltage of Q5 starts to rise immediately at a rate set by the current source I1 and Miller capacitor C1. As a result of this slewing effect, there still remains a delay before $V_{out}$ follows $V_{in}$.

Figure 2:
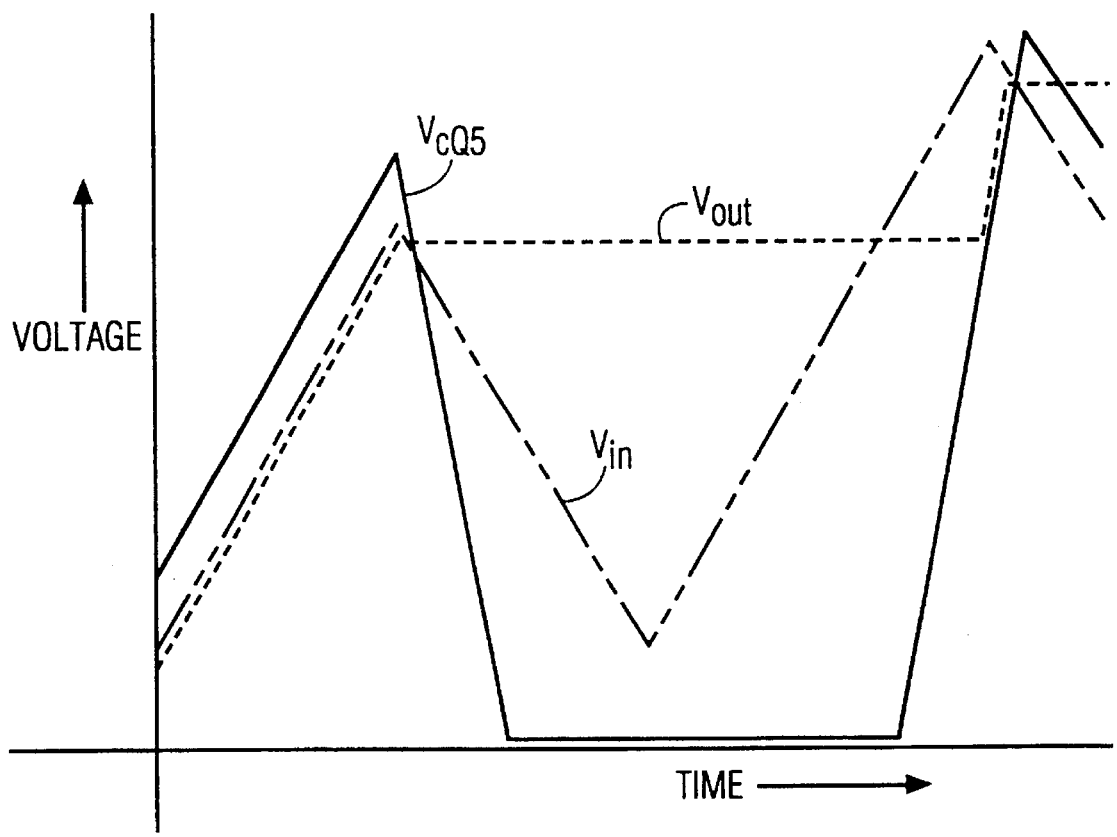
FIG. 2 is a graphical representation of the transient response of the peak detector circuit of FIG. 1.

FIG. 2 shows the transient response of the peak detector of FIG. 1. As shown, the peak of the input voltage $V_{in}$ has already passed when the output $V_{out}$ is slewed back up. The implication is that for fast changing signals relative to the slew rate of the peak detector, this delay can cause accuracy errors. In addition, if the circuit consists of more than the two stages shown in FIG. 1, more than one Schottky diode may be needed to prevent saturation of other transistors. This is undesirable due to the increased size of the die that would be required to make the circuit.

Figure 3:
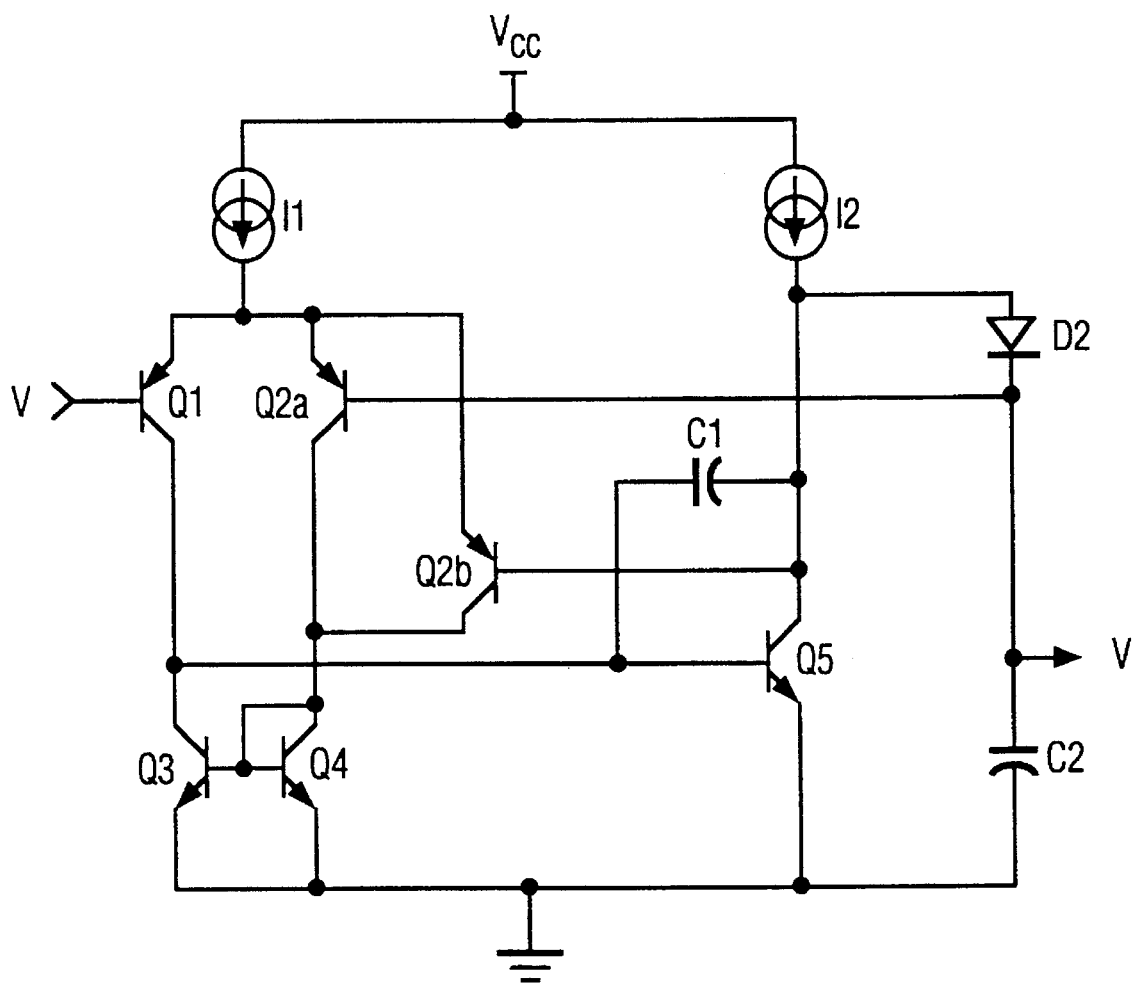
FIG. 3 is a schematic circuit diagram of a peak detector according to the invention.

The circuit of FIG. 3 is similar to that of the prior art circuit of FIG. 1, except that the Schottky diode D1 has been removed and an additional input transistor Q2b has been added. Transistor Q2b has its emitter and collector coupled to the emitter and collector of transistor Q2a, respectively, while the base of Q2b is connected to the collector of Q5. As described earlier, if the input voltage decreases below the value that is stored on output capacitor C2, the feedback is interrupted and diode D2 becomes reverse biased. As a result of the voltage decrease, the collector voltage of Q5 ($V_{cQ5}$) decreases, but now only to one diode voltage below the output voltage. At this point, and before any further decrease in $V_{cQ5}$, the feedback is restored through the additional input transistor Q2b. As a result of this operation, the remaining circuit elements to the left of diode D2 remain properly biased and particularly not in saturation.

When the input voltage is subsequently increased beyond the voltage stored on capacitor C2, the circuit restores the feedback through input transistor Q2a. Therefore, the collector voltage ($V_{cQ5}$) of Q5 now only has to slew over one diode voltage, and the response of the circuit is much faster.

Figure 4:
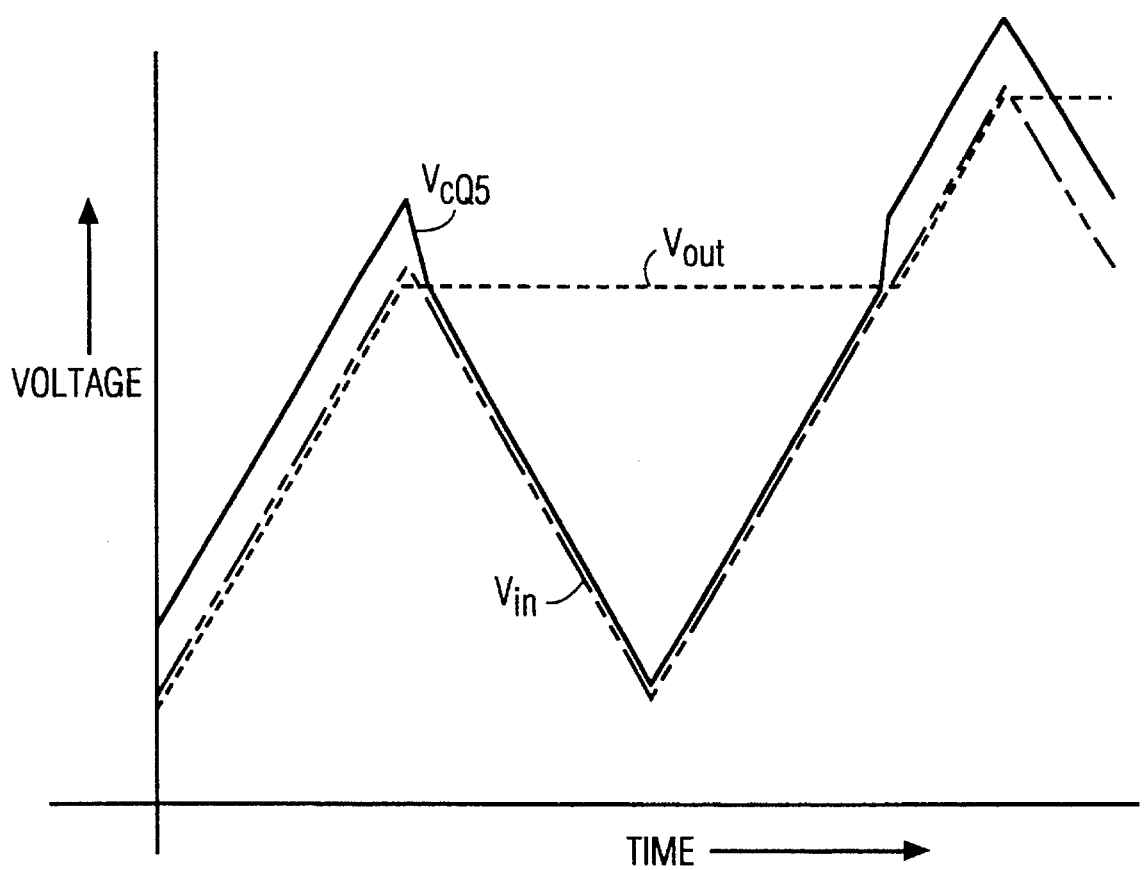
FIG. 4 is a graphical representation of the transient response of the peak detector circuit of FIG. 3.

FIG. 4 shows the transient response of the circuit of FIG. 3 according to the invention. Since the feedback response is much faster, the output $V_{out}$ can now accurately track the input voltage $V_{in}$. Under these circumstances, the collector voltage of Q5 ($V_{cQ5}$) is not forced negative, and the response time is significantly increased.

Although the additional feedback loop of the circuit shown in FIG. 3 consists of bipolar pnp transistors, the same approach can also be applied to circuits consisting of MOS transistors, In addition, both p-type and n-type devices can be used in the primary and additional feedback loop.

While one embodiment of the present invention has been shown and described, it is to be understood that many changes and modifications may be made thereunto without departing from the spirit and scope of the invention as defined in the appended claims.

What is claimed is:

1. A method for improving the speed and accuracy of a peak detector circuit utilizing a feedback amplifier configuration and subject to changing input voltages, the circuit having an input stage of transistors, a second stage transistor, and a capacitor coupled to said second stage transistor, the input stage having a first and a second transistor, the method comprising the steps of:

maintaining the proper biasing of the circuit elements within the feedback amplifier configuration by adding an additional input transistor thereby preventing the saturation of the second stage transistor, and interrupting the primary feedback loop around the amplifier configuration.

2. The method according to claim 1, wherein the emitter and collector of the additional transistor are coupled to the emitter and collector of the second transistor of the input stage, respectively.

3. The method according to claim 2, wherein the base of the additional input transistor is connected to the collector of the second stage transistor.

4. The method according to claim 3, wherein the additional input transistor prevents the interruption of the feedback to the circuit by limiting the decrease in collector voltage across the second stage transistor caused by a decrease in the input voltage.

5. An apparatus for improving the speed and accuracy of a peak detector circuit utilizing a feedback amplifier configuration and having an input stage of transistors, a second stage transistor, and a capacitor coupled to said second stage transistor, the input stage having a first and second transistor, the apparatus comprising:

an additional input transistor connected to the input stage and the second stage transistors for maintaining the feedback operation of the circuit over a varying range of input voltage values.

6. The apparatus according to claim 5, wherein the emitter and collector of said additional input transistor are connected to the emitter and collector, respectively, of the second transistor of the input stage, and the base of said additional input transistor is connected to the collector of the second stage transistor.

7. The apparatus according to claim 6, wherein said additional input transistor maintains the proper biasing of the other circuit elements in the feedback amplifier circuit throughout the range of input voltage values.

8. The apparatus according to claim 7, wherein said additional input transistor further prevents the saturation of the other transistor elements of the feedback amplifier caused by varying input voltage values.

9. A method for improving the speed and accuracy of a peak detector circuit utilizing a feedback amplifier configuration and subject to changing input voltages, the circuit having an input stage of transistors, at least one additional stage after the input stage, and a capacitor coupled to said at least one additional stage, the method comprising the step of:

maintaining the proper biasing of the circuit elements within the feedback amplifier configuration by adding an additional input transistor between the input stage and the at least one additional stage thereby preventing the saturation of the input transistors, and interrupting the primary feedback loop around the amplifier configuration.

10. An apparatus for improving the speed and accuracy of a peak detector circuit utilizing a feedback amplifier configuration and having an input stage of transistors, at least one additional stage after the input stage, and a capacitor coupled to said at least one additional stage, the apparatus comprising:

an additional input transistor connected between the input stage of transistors and the at least one additional stage for maintaining the feedback operation of the circuit over a varying range of input voltage values.

* * * * *